(12) United States Patent
Campanella-Pineda et al.

(10) Patent No.: US 10,530,334 B2
(45) Date of Patent: Jan. 7, 2020

(54) ACOUSTIC WAVE FILTER FORMED ON A V-GROOVE TOPOGRAPHY AND METHOD FOR PRODUCING THE SAME

(71) Applicant: GLOBALFOUNDRIES Singapore Pte. Ltd., Singapore (SG)

(72) Inventors: Humberto Campanella-Pineda, Singapore (SG); You Qian, Singapore (SG); Vibhor Jain, Essex Junction, VT (US); Anthony Stamper, Burlington, VT (US); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 84 days.

(21) Appl. No.: 15/976,597

(22) Filed: May 10, 2018

(65) Prior Publication Data
US 2019/0348966 A1 Nov. 14, 2019

(51) Int. Cl.
*H03H 9/56* (2006.01)
*H03H 3/04* (2006.01)
*H03H 9/13* (2006.01)
*H03H 9/17* (2006.01)
*H03H 3/02* (2006.01)

(52) U.S. Cl.
CPC .............. *H03H 9/564* (2013.01); *H03H 3/04* (2013.01); *H03H 9/13* (2013.01); *H03H 9/173* (2013.01); *H03H 9/175* (2013.01); *H03H 2003/021* (2013.01); *H03H 2003/025* (2013.01); *H03H 2003/0435* (2013.01)

(58) Field of Classification Search
CPC ............ H03H 9/564; H03H 3/04; H03H 9/13; H03H 9/173; H03H 9/175; H03H 2003/021; H03H 2003/025; H03H 2003/0435
USPC .................................................. 333/186
See application file for complete search history.

(56) References Cited

U.S. PATENT DOCUMENTS

| 5,498,920 A | 3/1996 | Okano et al. |
| 6,377,139 B1 * | 4/2002 | Horiuchi ............ H03H 9/02669 333/193 |
| 2003/0127946 A1 * | 7/2003 | Yamada ................. H01L 41/316 310/324 |

(Continued)

OTHER PUBLICATIONS

Solal et al., "Oriented lithium niobate layers transferred on 4" (100) silicon wafer for RF SAW devices", published in 2002 IEEE Ultrasonics Symposium pp. 131-134. (Year: 2002).*

(Continued)

*Primary Examiner* — Benny T Lee
*Assistant Examiner* — Hafizur Rahman
(74) *Attorney, Agent, or Firm* — Ditthavong & Steiner, P.C.

(57) ABSTRACT

Methods of forming a shear-mode acoustic wave filter on V-shaped grooves of a [100] crystal orientation Si layer over a substrate and the resulting devices are provided. Embodiments include forming a set of V-shaped grooves in a [100] crystal orientation Si layer over a substrate; and forming a shear-mode acoustic wave filter over the V-shaped grooves, the shear-mode acoustic wave filter including a first metal layer, a thin-film piezoelectric layer, and a second metal layer, wherein the second metal layer is an IDT pattern or a sheet.

20 Claims, 19 Drawing Sheets

(56) References Cited

U.S. PATENT DOCUMENTS

| | | | |
|---|---|---|---|
| 2006/0154399 A1* | 7/2006 | Sauer | C12Q 1/6874 |
| | | | 438/48 |
| 2011/0045658 A1 | 2/2011 | Liu et al. | |
| 2012/0187804 A1 | 7/2012 | Gibbons et al. | |
| 2013/0056709 A1* | 3/2013 | Kim | H01L 27/14609 |
| | | | 257/30 |

OTHER PUBLICATIONS

Wilbers et al., "3D-fabrication of tunable and high-density arrays of crystalline silicon nanostructures", Journal of Micromechanics and Microengineering, 28 (2018) 044003 (11pp) (Year: 2018).*

Bjurstrom et al., "Dependence of the Electromechanical Coupling on the Degree of Orientation of c-Textured Thin ALN Films", IEEE Transactions on Ultrasonics, Ferroelectrics, and Frequency Control, vol. 51, No. 10, Oct. 2004, pp. 1347-1353.

Arakawa et al., "Deposition Techniques of c-Axis-Tilted ScALN Films by Conventional RF Magnetron Sputtering", Proceedings of IEEE International Ultrasonics Symposium, 2010, pp. 1050-1053.

Yanagitani et al., "Giant Shear Mode Electromechnaical Coupling Coefficient K15 in c-Axis Tilted ScALN Films", Proceedings of IEEE International Ultrasonics Symposium, 2010, pp. 2095-2098.

Aigner, "SAW and BAW Technologies for RF Filter Applications: A Review of the Relative Strengths and Weaknesses", Proceedings of IEEE International Ultrasonics Symposium, 2008, pp. 582-589.

Campanella, "Tunable FBARs: Frequency Tuning Mechanisms", Proceedings of the 40th European Microwave conference, IEEE, Sep. 28-30, 2010, retrieved on Oct. 3, 2017 from https://www.researchgate.net/publication/251964575_Tunable_FBARs_Frequency_tuning_mechanisms, pp. 795-798.

Campanella et al., "Sensitivity of Thin-Film Bulk Acoustic Resonators (FBAR) to Localized Mechanical Forces", Journal of Micromechanics and Microengineering, vol. 23, No. 6, May 13, 2013, 9 Pages.

Rocas et al., "Third Order Intermodulation Distortion in Film Bulk Acoustic Resonators at Resonance and Antiresonance", Proceedings of IEEE MTT-S International Microwave Symposium Digest, 2008, retrieved on Oct. 3, 2017 from https://www.researchgate.net/publication/224330667_Third_order_intermodulation_distortion_in_Film_Bulk_Acoustic_Resonators_at_resonance_and_antiresonance, pp. 1259-1262.

* cited by examiner

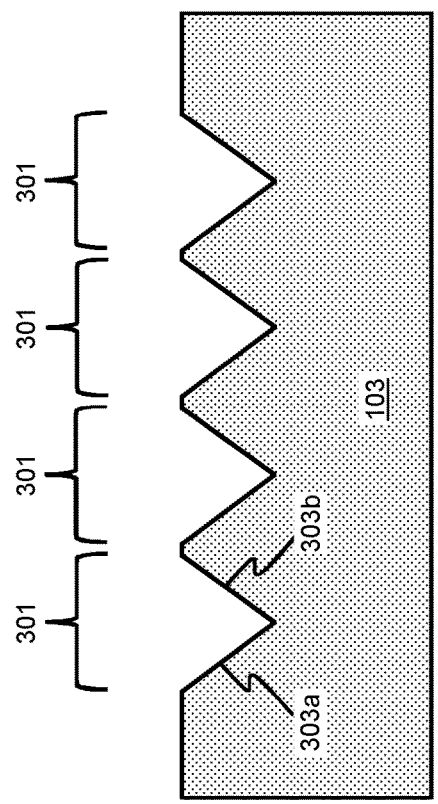
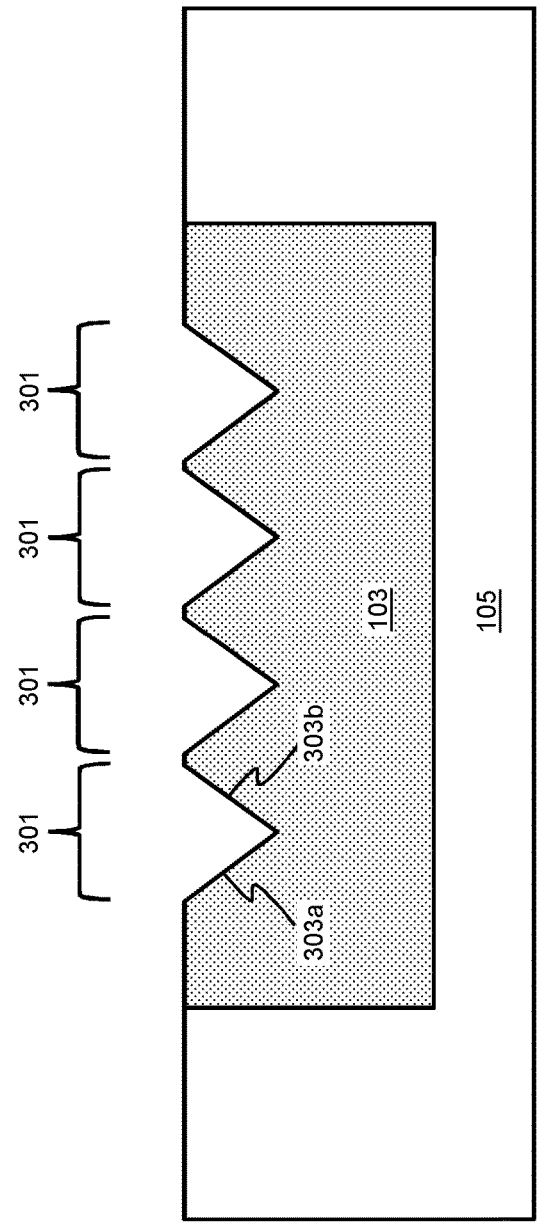

US 10,530,334 B2

ACOUSTIC WAVE FILTER FORMED ON A V-GROOVE TOPOGRAPHY AND METHOD FOR PRODUCING THE SAME

CROSS-REFERENCE TO RELATED APPLICATION

This application is related to U.S. Nonprovisional Application, entitled "SHEAR-MODE CHEMICAL/PHYSICAL SENSOR FOR LIQUID ENVIRONMENT SENSING AND METHOD FOR PRODUCING THE SAME," being filed concurrently.

TECHNICAL FIELD

The present disclosure relates to microelectromechanical systems (MEMS) design for semiconductor devices. The present disclosure is particularly applicable to acoustic wave filters.

BACKGROUND

Surface Acoustic Wave (SAW)(lateral mode) filters and bulk acoustic wave (BAW)(vertical mode) filters are being manufactured and are suitable for low/mid and mid/high long-term evolution (LTE) mobile bands, respectively. Lamb-wave (lateral mode) filters are not yet being manufactured, but are theoretically promising. However, SAW filters are stand alone and not extendable to LTE high and $5^{th}$ generation (5G) bands; a BAW filter's center frequency is determined by the thickness of the thin-film piezoelectric layer, e.g., aluminum nitride (AlN), so integrating multiple frequencies on a single chip requires repeated masking and thinning of the thin-film piezoelectric layer with associated tolerance and cost degradation; and Lamb-wave filters have an unacceptable low coupling coefficient ($k^2_{eff}$), which precludes commercial use. Further, known acoustic wave filters are often susceptible to warping/buckling and excessive center frequency variability.

A need therefore exists for methodology enabling formation of an acoustic wave filter with a relatively high $k^2_{eff}$ and large bandwidth, reduced beam bending variability and improved center frequency variability, and a high electromechanical $k^2_{eff}$ enabling commercial use and the resulting device.

SUMMARY

An aspect of the present disclosure is a method of forming a shear-mode acoustic wave filter on V-shaped grooves of a [100] crystal orientation (silicon) Si layer over a substrate.

Another aspect of the present disclosure is a device including a shear-mode acoustic wave filter on V-shaped grooves of a [100] crystal orientation Si layer over a substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a set of V-shaped grooves in a [100] crystal orientation Si layer over a substrate; and forming a shear-mode acoustic wave filter over the V-shaped grooves, the shear-mode acoustic wave filter including a first metal layer, a thin-film piezoelectric layer, and a second metal layer, wherein the second metal layer is an interdigitated (IDT) pattern or a sheet.

Another aspect of the present disclosure is a device including: a set of V-shaped grooves in a [100] crystal orientation Si layer over a substrate; and a shear-mode acoustic wave filter over the V-shaped grooves, the shear-mode acoustic wave filter including a first metal layer, a thin-film piezoelectric layer, and a second metal layer, wherein the second metal layer is an IDT pattern or a sheet.

A further aspect of the present disclosure is a device including: a set of a [111] V-shaped grooves in a [100] crystal orientation Si layer over a substrate of sapphire, silica glass, or [111] crystal orientation Si, each opposing slope of the [111] V-shaped grooves having an angle between 10 degrees and 70 degrees; a shear-mode acoustic wave filter over the set of the [111] V-shaped grooves, the shear-mode acoustic wave filter including a first metal layer, a thin-film piezoelectric layer, and a second metal layer in an IDT pattern with a same or a different lateral width across the set of the [111] V-shaped grooves; pairs of vias through the thin-film piezoelectric layer and the first metal layer down to the [100] crystal orientation Si layer, each via of a pair formed on an opposite side of the set of the [111] V-shaped grooves; and a cavity in the [100] crystal orientation Si layer under the shear-mode acoustic filter, the cavity extending beyond the set of the [111] V-shaped grooves.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B through 5A and 5B, respectively, and 6 through 9 schematically illustrate cross-sectional views of a process flow for forming a shear-mode acoustic wave filter on V-shaped grooves of a [100] crystal orientation Si layer over a substrate, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of SAW filters being solely stand alone and not extendable to LTE high and 5G bands; a BAW filter's center frequency being determined by the thickness of the thin-film piezoelectric layer such that integrating multiple frequencies on a single chip requires repeated masking and thinning of the thin-film piezoelectric layer with associated tolerance and cost degradation; Lamb-wave filters having an unacceptably low $k^2_{eff}$, precluding commercial use; and known acoustic wave filters being susceptible to warping/buckling and excessive center frequency variability attendant upon forming an acoustic wave filter. The problems are solved, inter alia, by forming a shear-mode acoustic wave filter on V-shaped grooves of a [100] crystal orientation Si layer over a substrate.

Methodology in accordance with embodiments of the present disclosure includes forming a set of V-shaped grooves in a [100] crystal orientation Si layer over a substrate. A shear-mode acoustic wave filter is formed over the V-shaped grooves, the shear-mode acoustic wave filter includes a first metal layer, a thin-film piezoelectric layer, and a second metal layer, wherein the second metal layer is an IDT pattern or a sheet.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
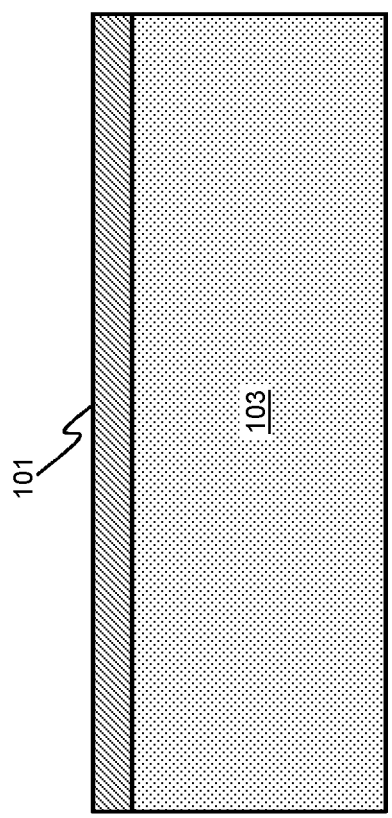
Figure 1B:
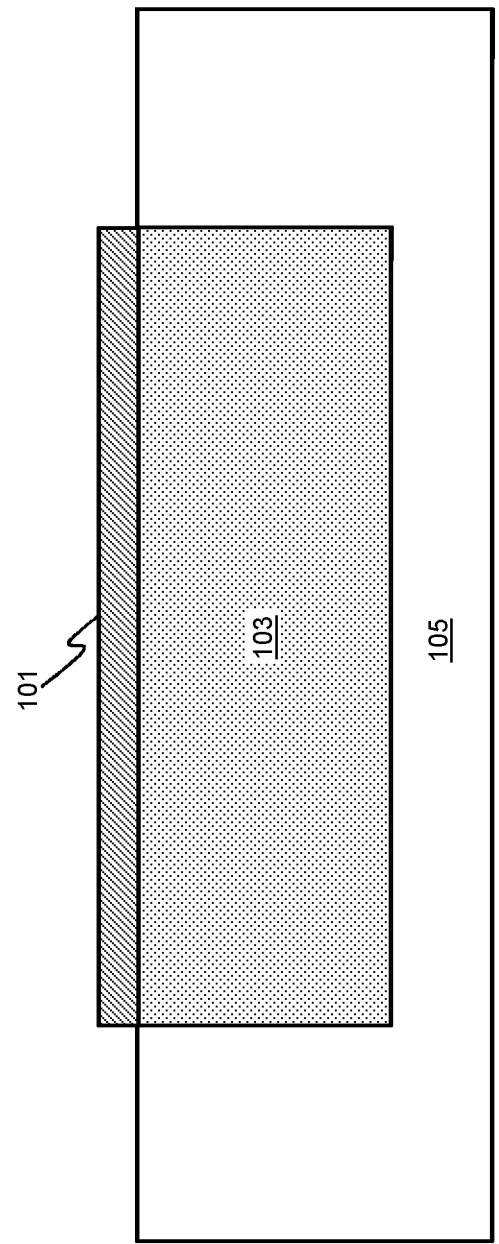
Figure 9:
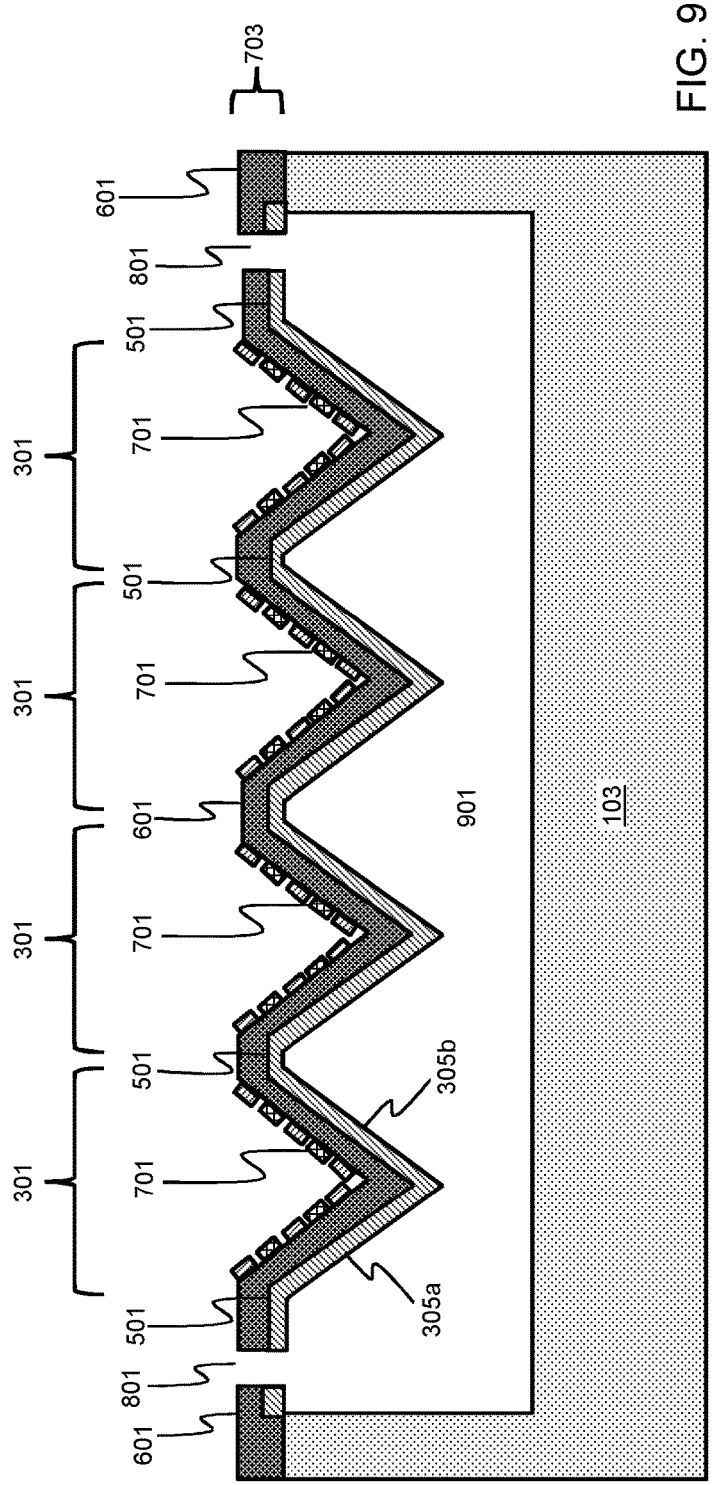
Figure 10:
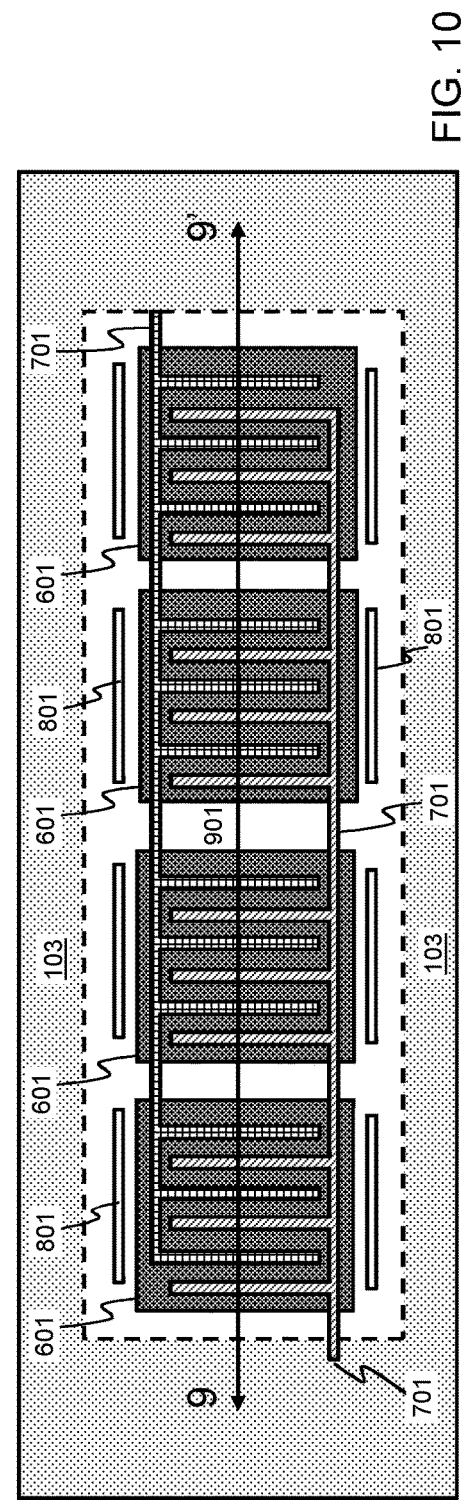
FIG. 10 schematically illustrates a top view of FIG. 9 showing the cut lines for FIG. 9.

FIGS. 1A and 1B through 5A and 5B, respectively, and 6 through 9 schematically illustrate cross-sectional views of a process flow for forming a shear-mode acoustic wave filter on V-shaped grooves of a [100] crystal orientation Si layer over a substrate and FIG. 10 schematically illustrates a top view of FIG. 9 showing the cut lines for FIG. 9, in accordance with an exemplary embodiment. Referring to FIG. 1A, a photoresist (PR) or hard mask (HM) 101 is formed over a [100] crystal orientation Si layer 103 over a substrate (not shown for illustrative convenience). In one instance, the [100] crystal orientation Si layer 103 may be formed as a sacrificial layer in a substrate 105, as depicted in FIG. 1B. The substrate 105 may be formed of sapphire, silica glass, [111] crystal orientation Si, or a similar substrate material.

Figure 2A:
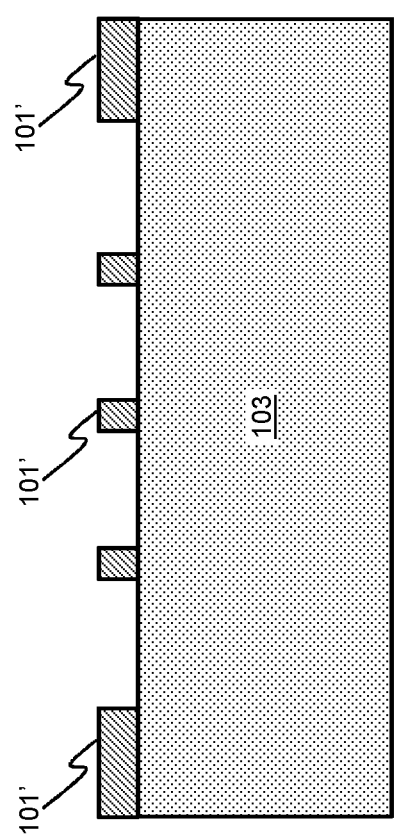
Figure 2B:
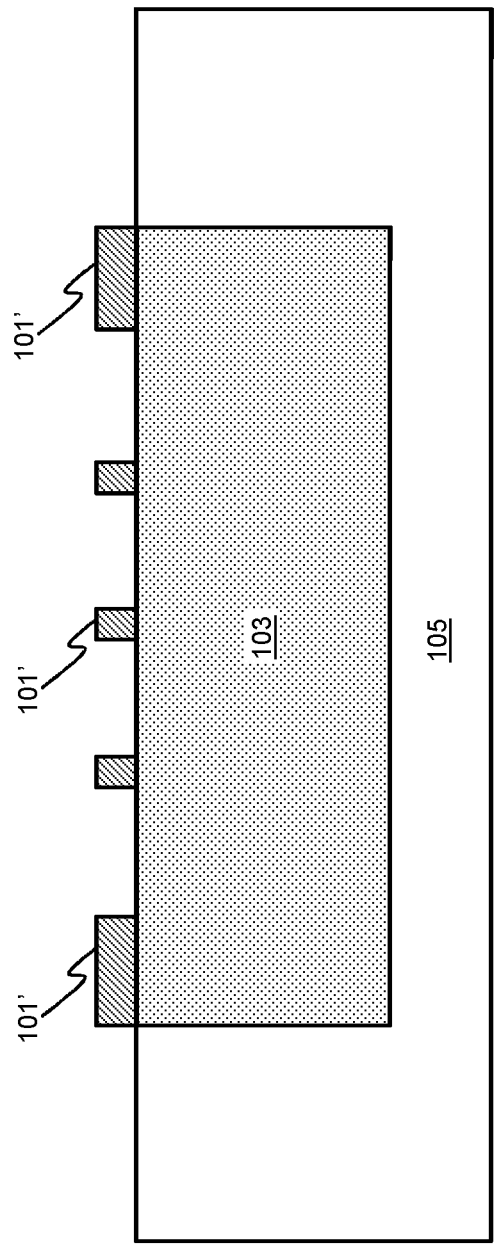
Figure 3A:
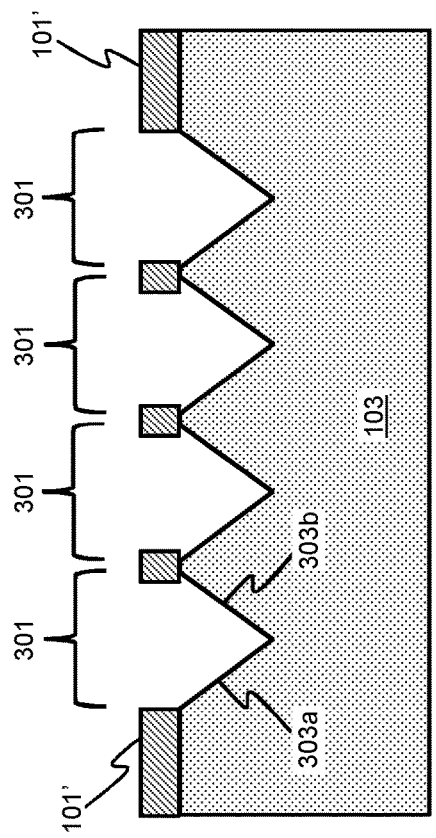
Figure 3B:
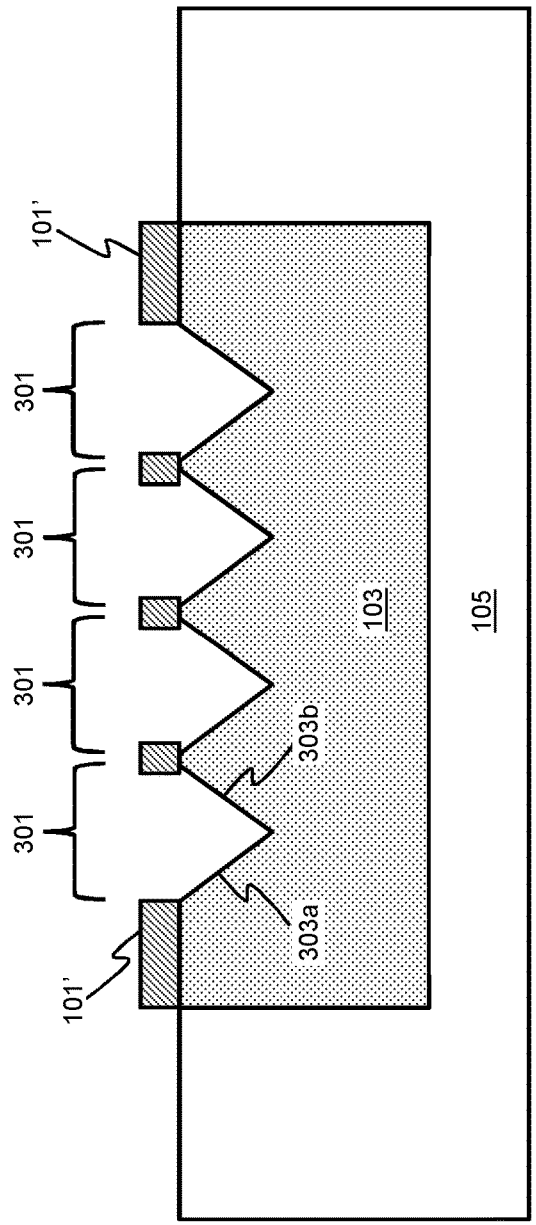

Referring to FIGS. 2A and 2B, the PR or HM 101 is patterned, e.g., by photolithography, depending on a desired width and depth of each subsequently formed V-shape groove, forming the PR or HM 101'. A set of V-shaped grooves 301 are then formed through the PR or HM 101' in a portion of the [100] crystal orientation Si layer 103 by a wet etch or a dry etch, as depicted in FIGS. 3A and 3B. In one instance, [111] V-shaped grooves 301 are formed by anisotropic wet etching using potassium hydroxide (KOH) or tetramethylammonium hydroxide (TMAH) until the surfaces 303a and 303b of each V-shaped groove 301 find each other. In this instance, the depth of each V-shaped groove 301 may be 5 micrometer (μm) by 5 μm in width and the surfaces 303a and 303b each have a slope of 54.7°. In one instance, an anisotropic dry etch process may be used to create the V-shaped grooves 301 with a variety of angles, e.g., the surfaces 303a and 303b each having a slope between 10° and 70°, which enables shear mode ($k^2_{15}$) and longitudinal mode ($k^2_{33}$) tailoring. For example, the V-groove 301 angle customization using dry etching may produce a max $k^2_{15}$ and quality (Q) and no $k^2_{33}$ between 30 degrees and 50 degrees.

Thereafter, the PR or HM 101' is stripped or removed, as depicted in FIGS. 4A and 4B. It should be understood that the number of V-shaped grooves 301 in FIGS. 1A and 1B through 5A and 5B, respectively, and 6 through 9 are meant to represent a section of a device; however, the specific number of V-shaped grooves 301 is for illustration convenience only and not intended as a limitation, e.g., the set or device may include a plurality of V-shaped grooves 301, 10 V-shaped grooves 301, or the set or device may include a 10×10 array of V-shaped grooves 301.

Figure 5A:
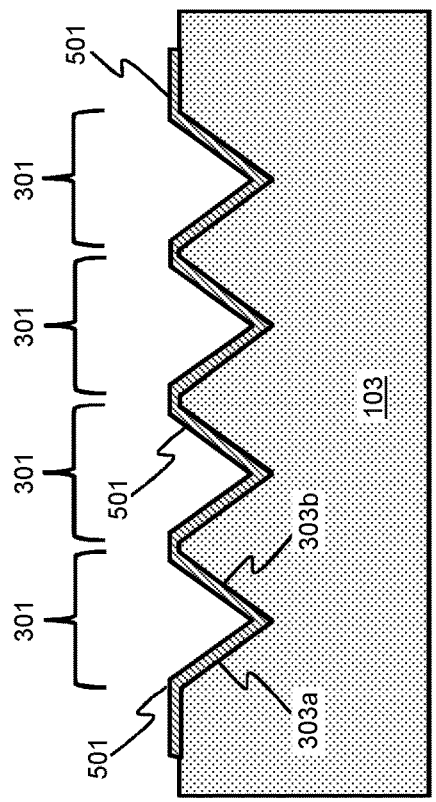
Figure 5B:
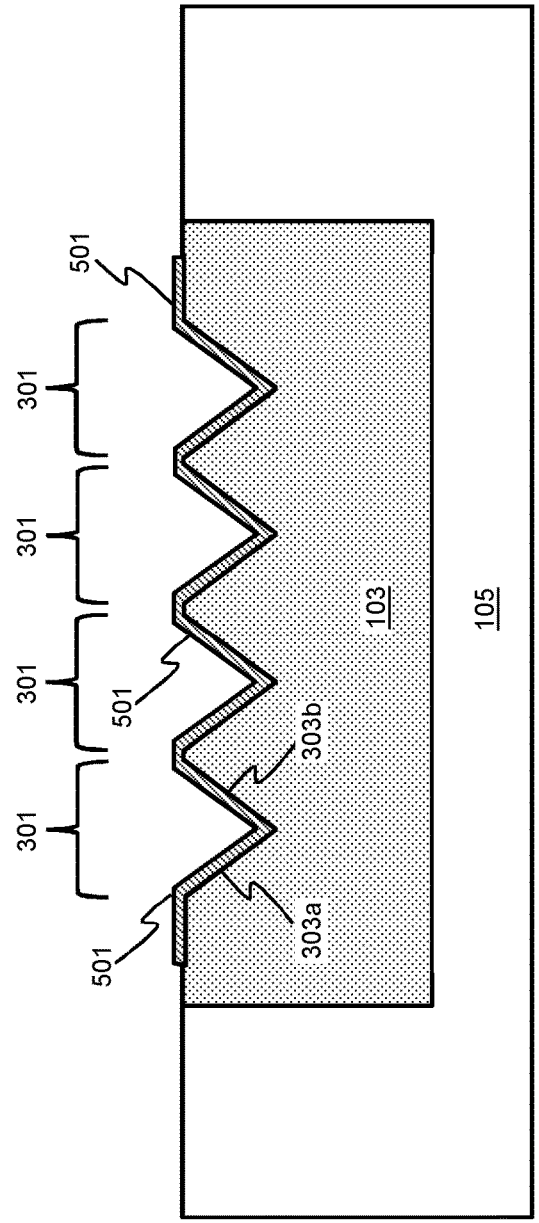

A dielectric isolation layer (not shown for illustrative convenience) is then formed over the [100] crystal orientation Si layer 103. Thereafter, a seed layer (not shown for illustrative convenience) is formed, e.g., of AlN, over and along the opposing surfaces/slopes of the dielectric isolation layer within the V-shaped grooves 301. In one instance, the seed layer may also be formed on respective portions of the [100] crystal orientation Si layer 103 adjacent to the V-shaped grooves 301. Thereafter, a metal layer 501 (bottom electrode of a subsequently formed shear-mode (lateral) acoustic wave filter) is formed, e.g., of molybdenum (Mo) or tungsten (W), over the [100] Si substrate 103 and patterned, as depicted in FIGS. 5A and 5B. In this instance, a portion of the metal layer 501 is formed outside of the V-shaped grooves 301 over a portion of the [100] crystal orientation Si layer 103; however, it may also just be formed within the V-shaped grooves 301. For the purpose of illustrative convenience, the subsequent steps described with respect to FIGS. 6 through 9 are described following FIG. 5A; however, it should be understood that the same steps may follow from FIG. 5B.

Figure 6:
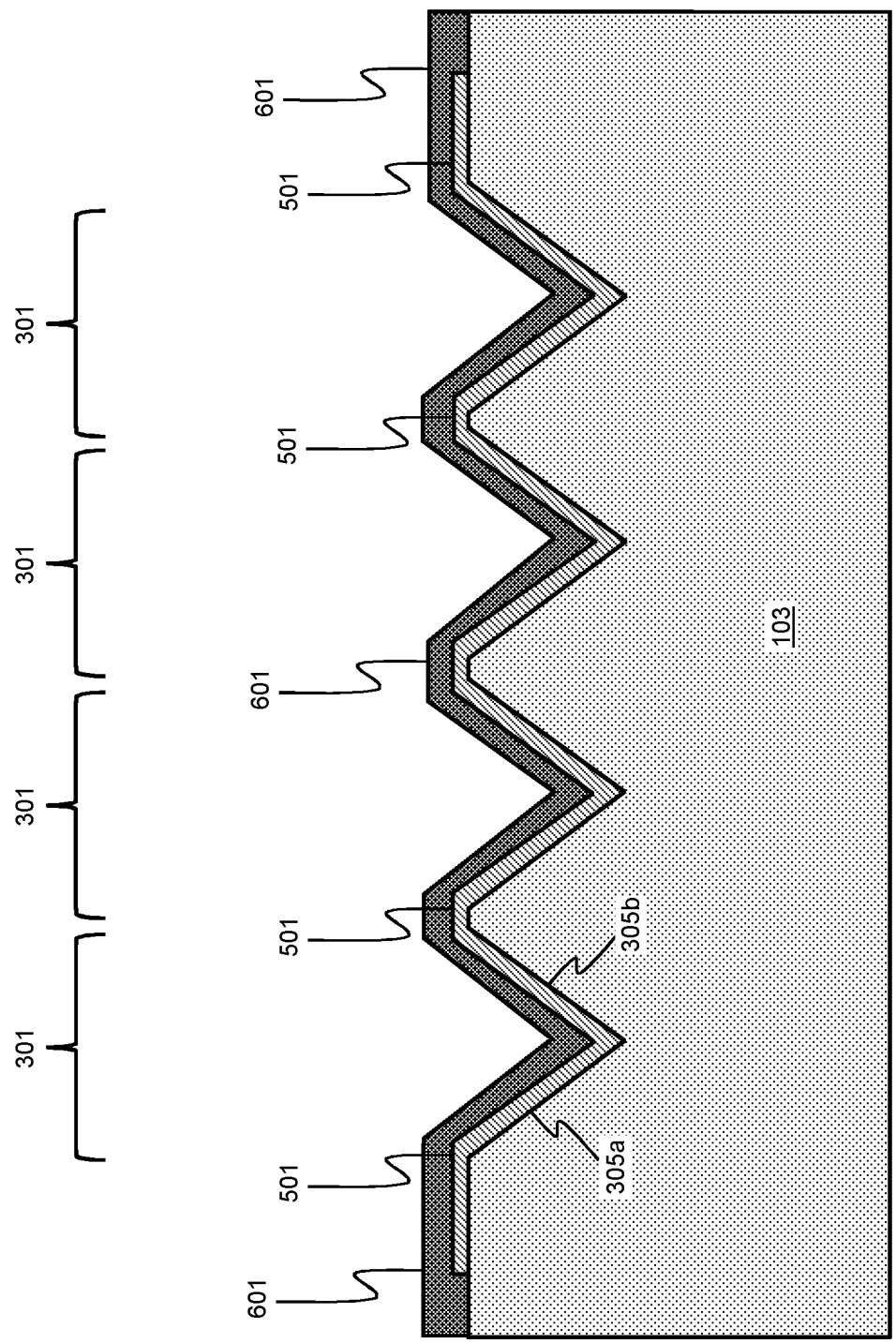

Referring to FIG. 6, a thin-film piezoelectric layer 601 of the subsequently formed shear-mode acoustic wave filter is formed, for example, of AlN, scandium aluminum nitride (ScAlN), zinc oxide (ZnO), lithium niobate (LiNbO$_3$), lithium tantalite (LiTaO$_3$), lead zirconate titanate (PZT), polyvinylidene fluoride (PVDF), or a material having similar functional properties, e.g., AlN, over the metal layer 501 by plasma vapor deposition (PVD). Specifically, the PVD deposition of the thin-film piezoelectric layer 601 on the V-shaped grooves 301 enables tilted c-axis crystals, which promotes $k^2_{eff}$ and bandwidth improvement relative to known acoustic wave filters. It should be understood that the material of the seed layer will change depending on the material of the thin-film piezoelectric layer 601. Again, in this instance, a portion of the thin-film piezoelectric layer 601 is formed outside of the V-shaped grooves 301 over a portion of the [100] crystal orientation Si layer 103; however, it may also just be formed within the V-shaped grooves 301 similar to the metal layer 501.

Figure 7:
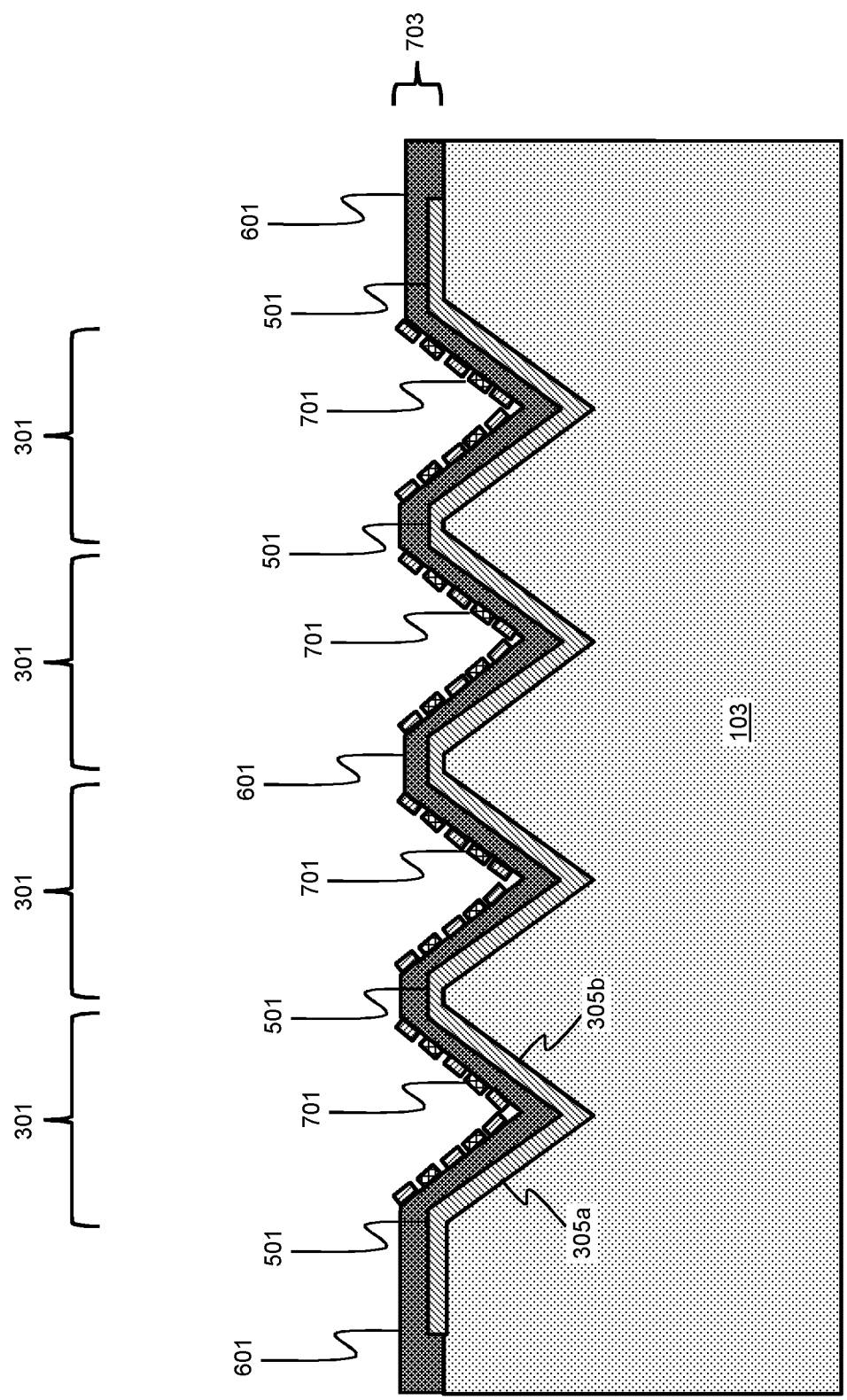
Figure 8:
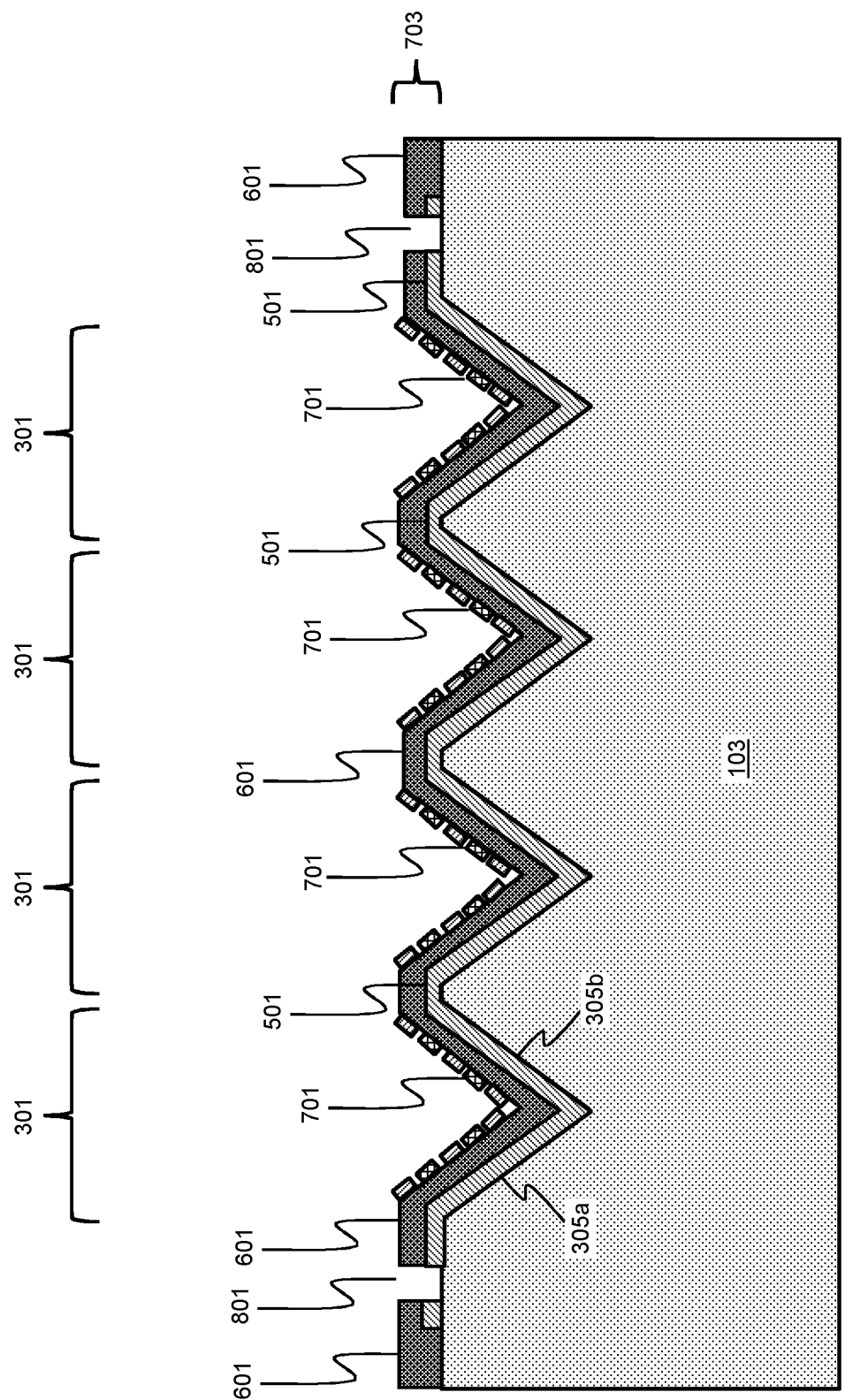
Figure 16:
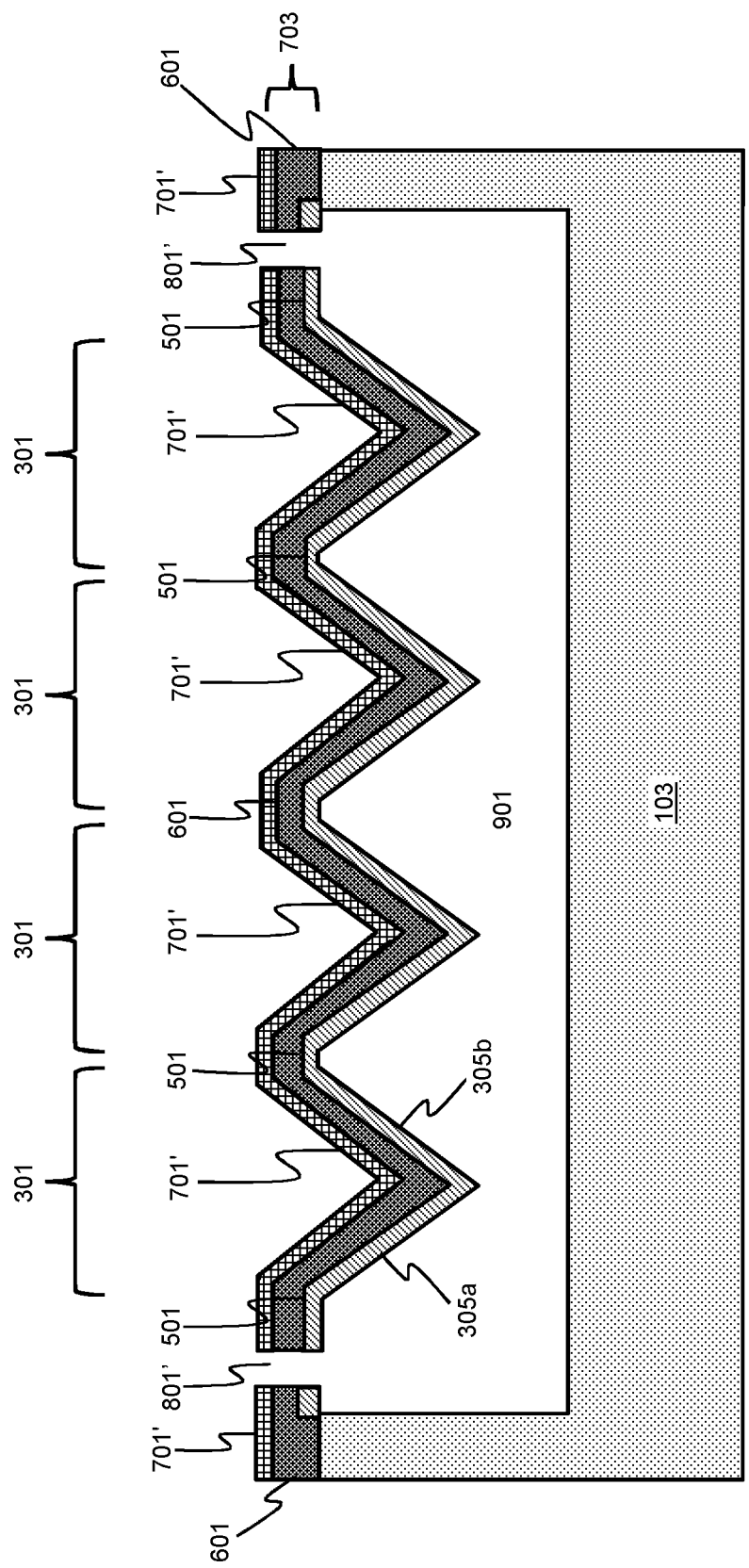
FIG. 16 schematically illustrates a cross-sectional view of FIG. 9 with a sheet top electrode over the thin-film piezoelectric layer of the shear-mode acoustic wave filter, in accordance with an exemplary embodiment.

Thereafter, a metal layer 701 (top electrode of the shear-mode acoustic wave filter 703) is formed, e.g., of Mo or W, in an IDT pattern along opposing slopes of the thin-film piezoelectric layer 601, as depicted in FIG. 7. The metal layer 701 may also be formed in a sheet along opposing slopes of the thin-film piezoelectric layer 601 as depicted in FIG. 13 or it may also be formed over the thin-film piezoelectric layer 601, as depicted in FIG. 16. For the purpose of illustrative convenience, FIGS. 7 through 9 are described and illustrated with respect to a metal layer 701 formed in an IDT pattern; however, it should be understood that substantially similar steps would follow if the metal layer 701 was formed in a sheet 701'. In this instance, where the metal layer 701 is formed in an IDT pattern, a spray coating (not shown for illustrative convenience) may be applied in connection with the formation of the metal layer 701 to avoid IDT pattern distortion due to thick and non-uniform PR coating along with an antireflective coating to avoid unwanted PR patterning due to V-reflected waves and an optional oxide filling and chemical mechanical polishing (CMP)(not shown for illustrative convenience) to ensure electrode patterning in the grooved area may take place. The individual digits or fingers of the IDT pattern 701 are formed of the same material; however, the individual digits or fingers may alternate in terms of polarity, as more clearly depicted in FIG. 10. In one instance, a multi-frequency shear-mode filter bank with larger bandwidth relative to the resultant device of FIG. 9 may be formed with the individual digits or fingers of the IDT pattern 701 having the same or different lateral widths per V-shaped groove 301, as depicted in FIG. 12.

Figure 11:
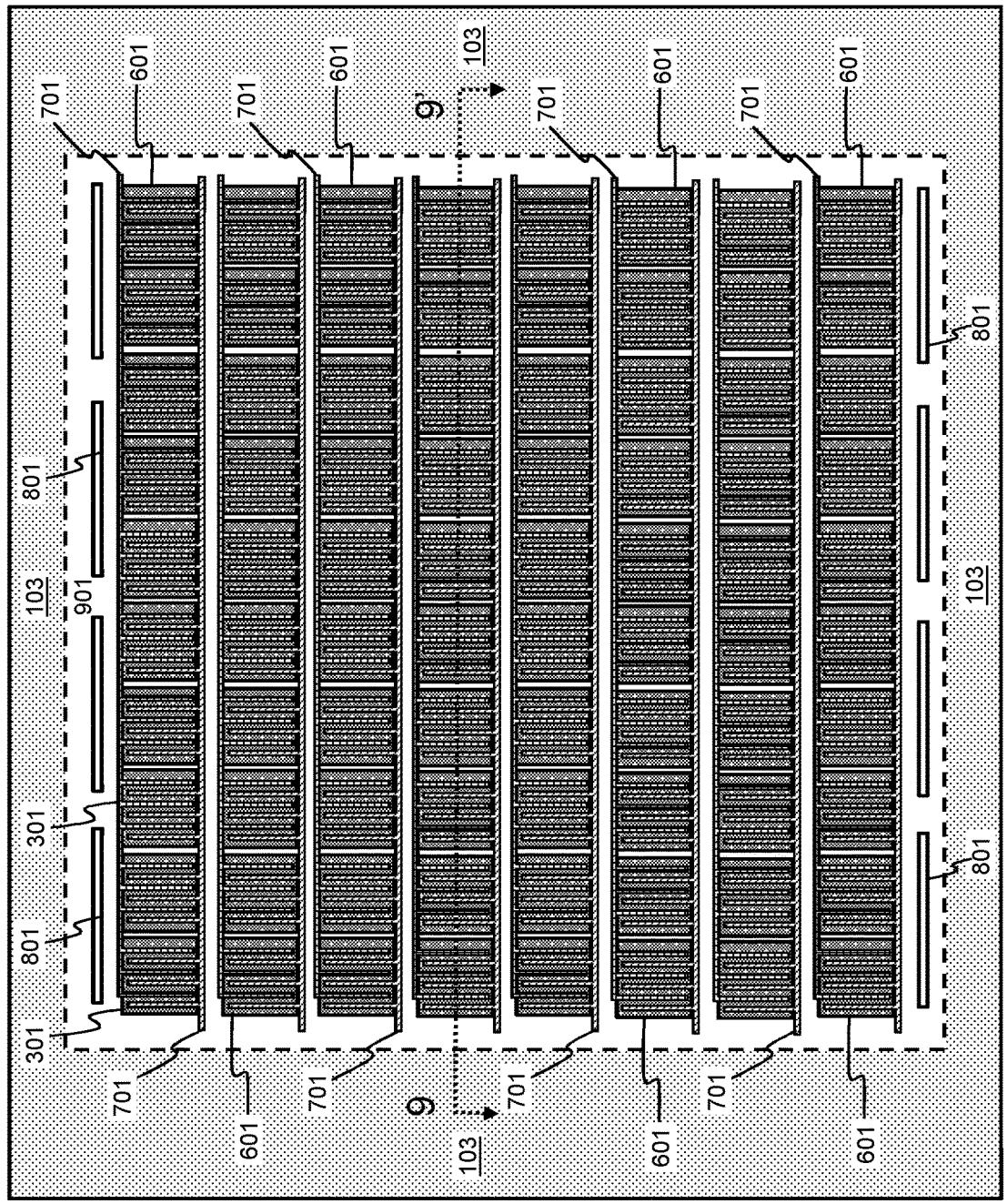
FIG. 11 schematically illustrates a top view of FIG. 9 in a 10×10 array, in accordance with an exemplary embodiment.

Referring to FIG. 8, vias 801 are formed through the thin-film piezoelectric layer 601 and the metal layer 501 down to the [100] crystal orientation Si layer 103 and then the [100] crystal orientation Si layer 103 is patterned through the vias 801 and a release is performed to form the cavity 901 in a portion of the [100] crystal orientation Si layer 103, e.g., a 40 μm×40 μm cavity, as depicted in FIG. 9. In the instance when the metal layer is formed in the sheet 701' over the thin-film piezoelectric layer 601 (FIG. 16), the vias 801 may be formed through the metal layer 701', the thin-film piezoelectric layer 601, and the metal layer 501 down to the [100] crystal orientation Si layer 103. Further, the cavity 901 may be deeper than the etch stop point for the V-shaped grooves 301 and the cavity 901 may extend beyond the set of V-shaped grooves 301. Also, the cavity 901 may be formed as a single cavity or as multiple cavities underneath the V-shaped grooves 301. Moreover, in one instance, a single cavity 901 may be formed under all of the V-shaped groves 301, for example, a 10 row or 10 column array of 10 V-shaped grooves per each row or column, e.g., a 100 μm×100 μm array, as depicted in FIG. 11. Thereafter, a capping (bonded) wafer or thin-film encapsulation layer and cap cavity (all not shown for illustrative convenience) may be formed over the set of V-shaped grooves 301 and the [100] crystal orientation Si layer 103.

Figure 12:
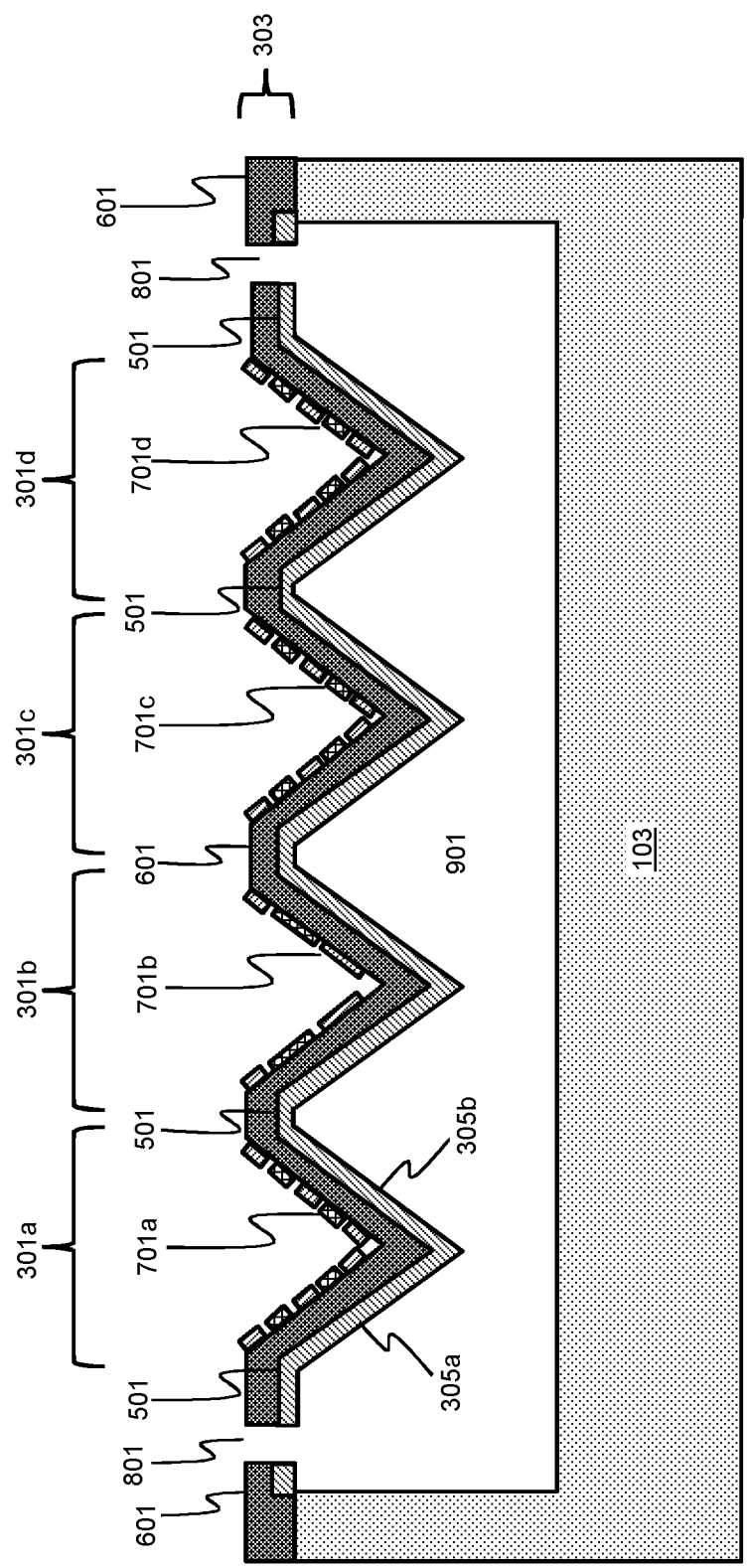
FIG. 12 schematically illustrates a cross-sectional view of FIG. 9 with IDT top electrodes having different lateral widths, in accordance with an exemplary embodiment.
Figure 13:
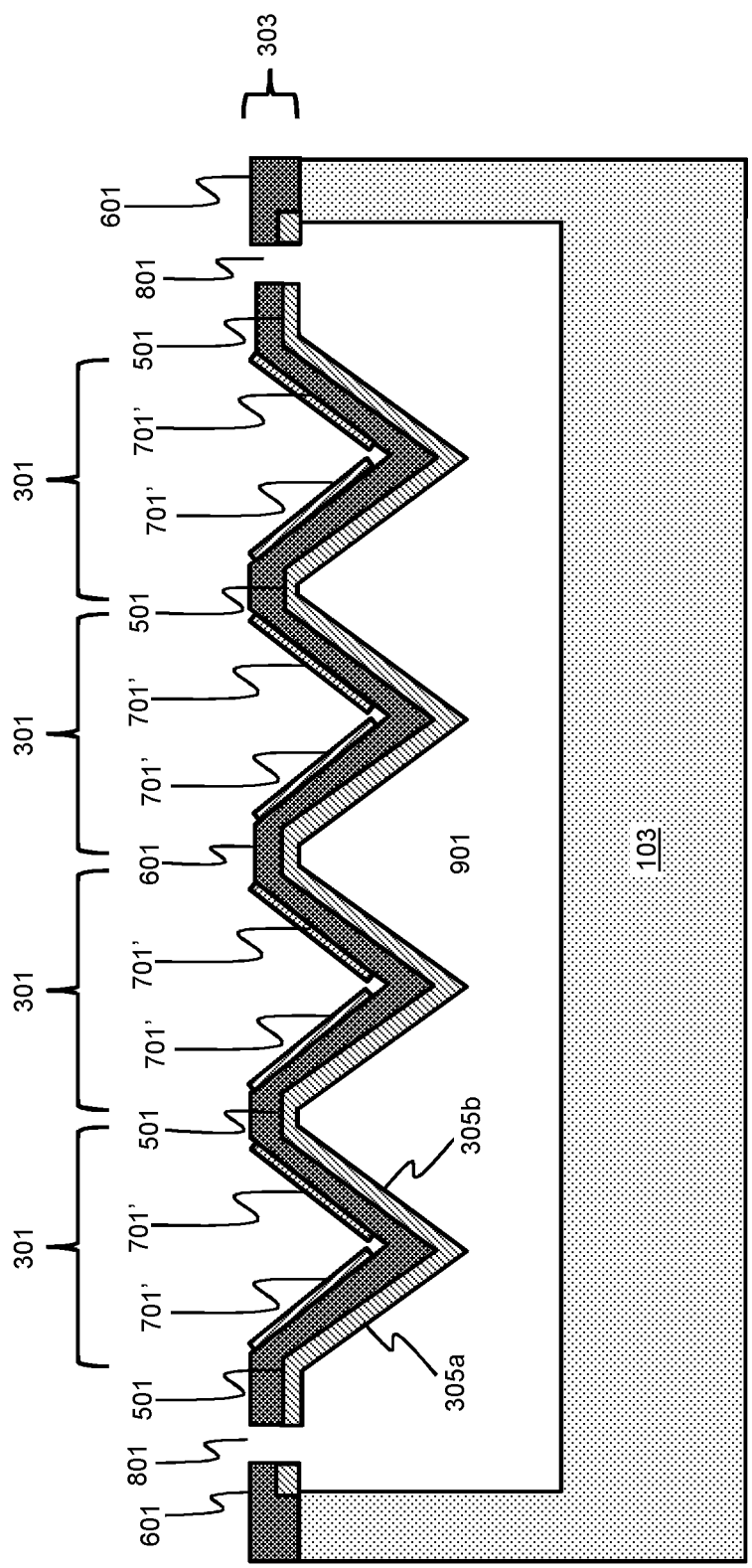
FIG. 13, schematically illustrates a cross-sectional view of FIG. 9 with a sheet top electrode along opposing slopes of the thin-film piezoelectric layer of the shear-mode acoustic wave filter, in accordance with an exemplary embodiment.

FIG. 12 schematically illustrates a cross-sectional view of FIG. 9 with IDT top electrodes having different lateral widths, in accordance with an exemplary embodiment. FIG. 12 is nearly identical to FIG. 9; however, each IDT finger of the metal layer 701 of FIG. 9 is formed with a CD consistent with a desired frequency so that the resultant device (not shown for illustrative convenience) can function as a multi-frequency shear-mode filter bank with a large bandwidth without needing expensive ScAlN. For example, the IDT fingers 701a of the V-shaped groove 301a may be formed with a CD of 0.5 μm to 1.0 μm; the IDT fingers 701b of the V-shaped groove 301b may be formed with a CD of 1.0 μm to 2.0 μm; the IDT fingers 701c of the V-shaped groove 301c may be formed with a CD of 0.5 μm to 0.7 μm; and the IDT fingers 701d of the V-shaped groove 301d may be formed with a CD of 0.5 μm to 1.0 μm producing a central frequency of 2.4 gigahertz (GHz), 1.2 GHz, 3.5 GHz, and 2.7 GHz, respectively, and a wavelength of 3.3 μm, 6.6 μm, 2.5 μm, and 3.0 μm, respectively.

FIG. 13, schematically illustrates a cross-sectional view of FIG. 9 with a sheet top electrode along opposing slopes of the thin-film piezoelectric layer of the shear-mode acoustic wave filter, in accordance with an exemplary embodiment. FIG. 13 is nearly identical to FIG. 9; however, in this instance the metal layer 701' is formed in a sheet along opposing slopes of the thin-film piezoelectric layer 601. It should be understood that the metal layer 701' can also be formed in a sheet over the thin-film piezoelectric layer 601, as depicted in FIG. 16.

Figure 14:
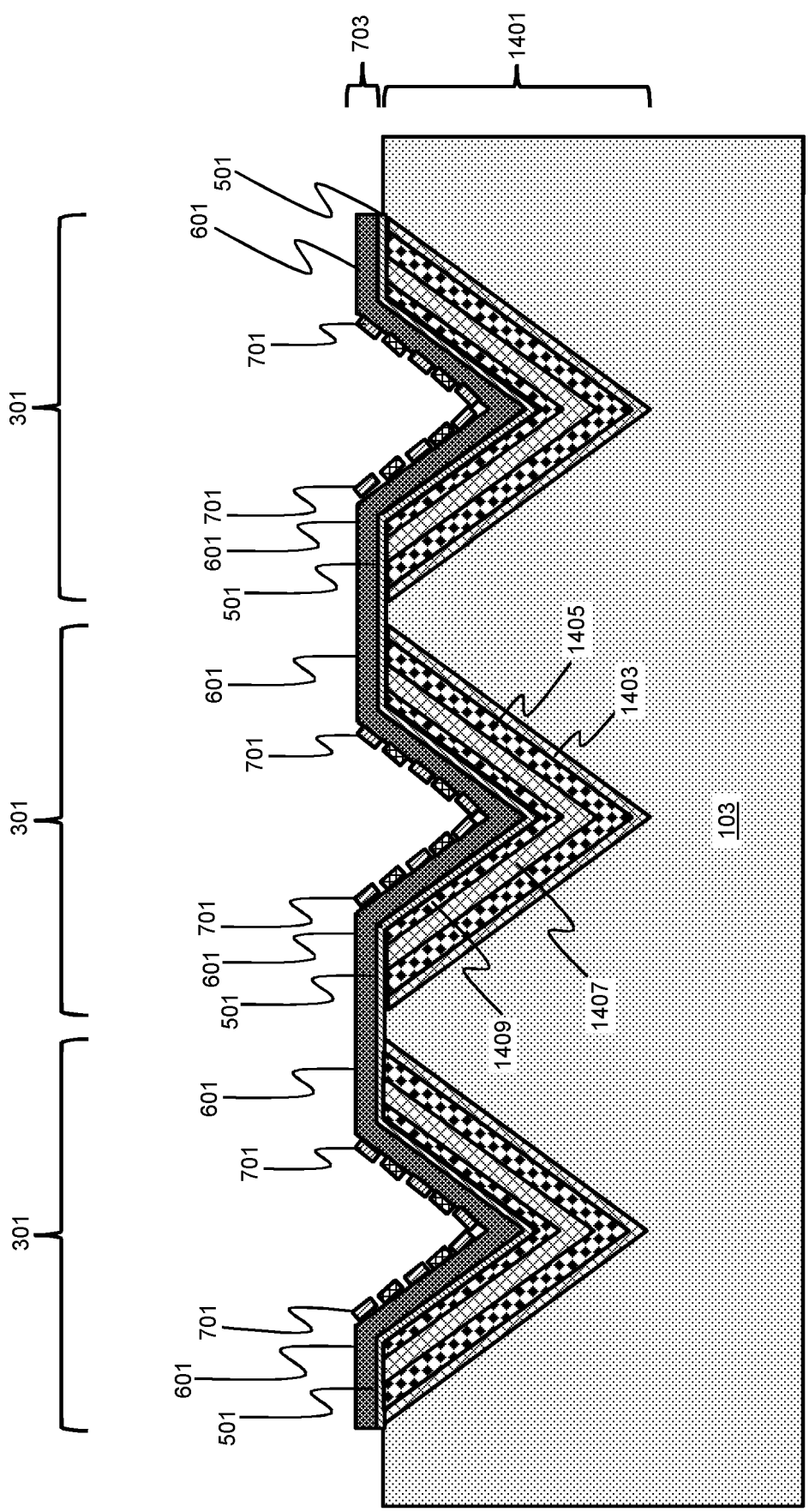
FIG. 14 schematically illustrates a cross-sectional view of FIG. 9 with a Bragg reflector formed on the V-shaped grooves of the [100] crystal orientation Si layer under the shear-mode acoustic wave filter and without a cavity, in accordance with an exemplary embodiment.

FIG. 14 schematically illustrates a cross-sectional view of FIG. 9 with a Bragg reflector formed on the V-shaped grooves of the [100] crystal orientation Si layer under the shear-mode acoustic wave filter and without a cavity, in accordance with an exemplary embodiment. FIG. 14 is nearly identical to FIG. 7; however, in this instance, a Bragg reflector 1401 is formed, e.g., by depositing layers of alternating high/low acoustic impedance thin-film material, e.g., a W layer 1403, a SiO$_2$ layer 1405, a W layer 1405, and a SiO$_2$ layer 1407, with as close as possible to an approximate thickness of nλ/4, wherein n is a positive odd integer, along the V-shaped grooves 301 of the [100] crystal orientation Si layer 103 prior to the forming of the metal layer 501 (bottom electrode), as described in FIG. 5. Specifically, the layers of the Bragg reflector 1401, e.g., W layer 1403, start at the etch stop point (apex of the V-shaped groove 301). The layers of the Bragg reflector 1401 are then planarized, e.g., by CMP, down to the [100] crystal orientation Si layer 103. Thereafter, contacts (not shown for illustrative convenience)

may be formed down to the shear-mode acoustic wave filter 703, e.g., through an interlayer dielectric (ILD) layer (not shown for illustrative convenience).

Figure 15:
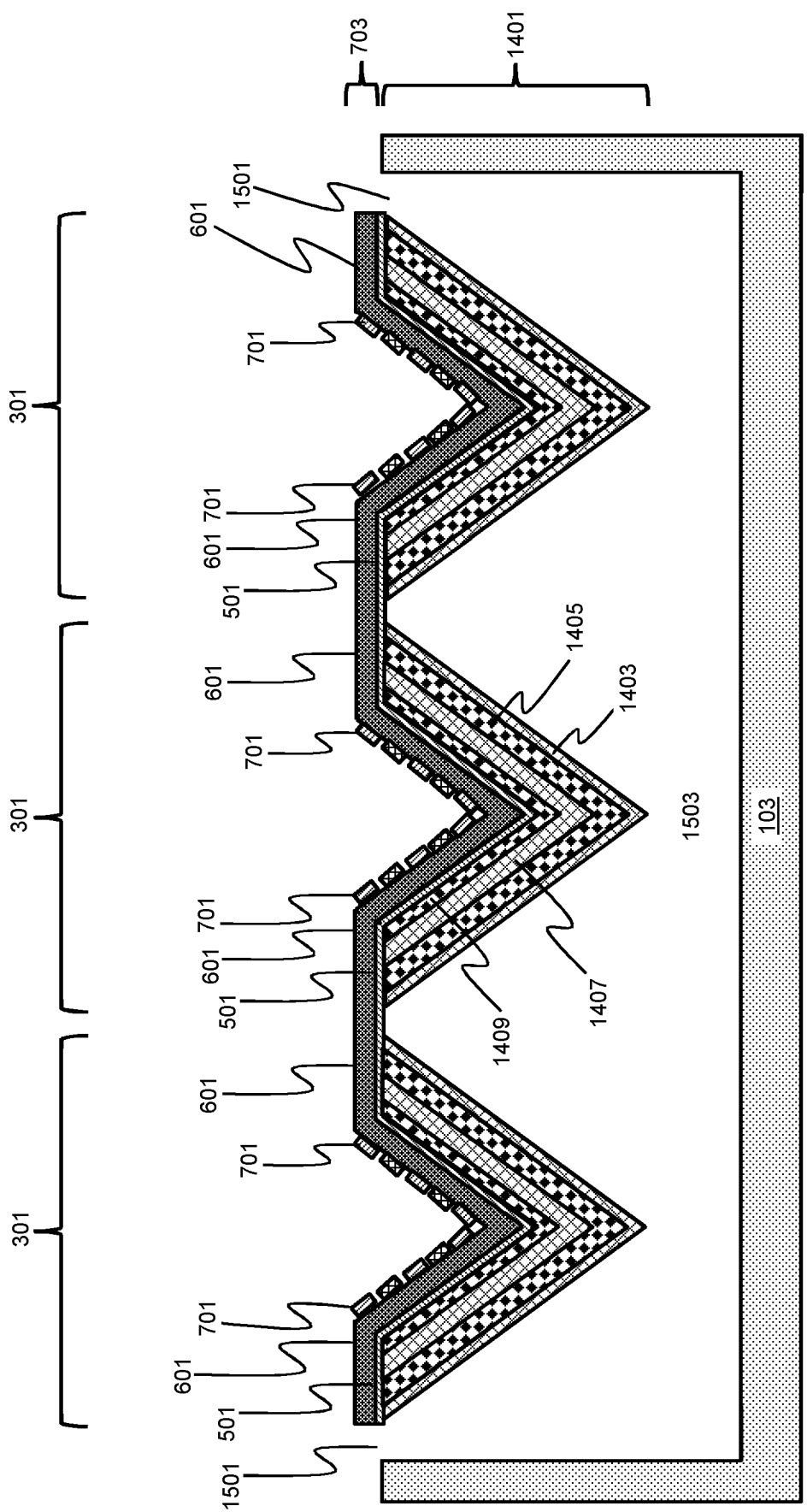
FIG. 15 schematically illustrates a cross-sectional view of FIG. 14 with a cavity under the Bragg reflector, in accordance with an exemplary embodiment.

FIG. 15 schematically illustrates a cross-sectional view of FIG. 14 with a cavity under the Bragg reflector, in accordance with an exemplary embodiment. FIG. 15 is nearly identical to FIG. 14; however, in this instance, similar to the process steps described with respect to FIGS. 8 and 9, vias 1501 are formed through the thin-film piezoelectric layer 601 and the metal layer 501 down to the [100] crystal orientation Si layer 103 and then the [100] crystal orientation Si layer 103 is patterned through the vias 1501 and a release is performed to form the cavity 1503.

FIG. 16 schematically illustrates a cross-sectional view of FIG. 9 with a sheet top electrode over the thin-film piezoelectric layer of the shear-mode acoustic wave filter, in accordance with an exemplary embodiment. FIG. 16 is nearly identical to FIG. 9; however, in this instance, the metal layer 701' is formed in a sheet over the thin-film piezoelectric layer 601 rather than in the IDT pattern (metal layer 701 of FIG. 7). Consequently, in this instance, vias 801' are formed through the metal layer 701', the thin-film piezoelectric layer 601, and the metal layer 501 down to the [100] crystal orientation Si layer 103 and then the [100] crystal orientation Si layer 103 is patterned through the vias 801' and a release is performed to form the cavity 901.

Figure 17:
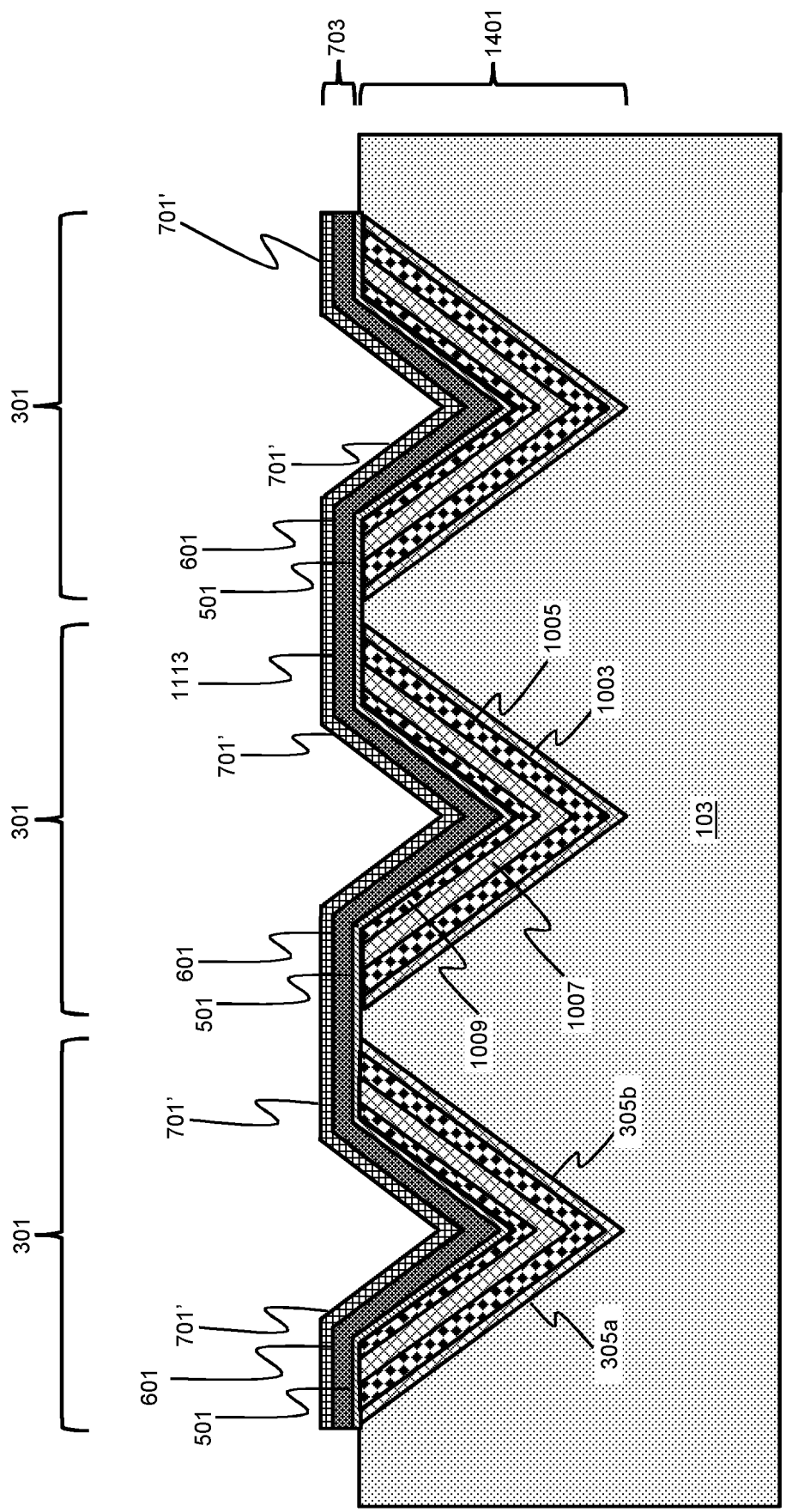
FIG. 17 schematically illustrates a cross-sectional view of a FIG. 14 with a sheet top electrode over the thin-film piezoelectric layer of the shear-mode acoustic wave filter, in accordance with an exemplary embodiment.

FIG. 17 schematically illustrates a cross-sectional view of a FIG. 14 with a sheet top electrode over the thin-film piezoelectric layer of the shear-mode acoustic wave filter, in accordance with an exemplary embodiment. FIG. 17 is nearly identical to FIG. 14; however, in this instance, the metal layer 701' is formed in a sheet over the thin-film piezoelectric layer 601 rather than in the IDT pattern (metal layer 701 of FIG. 7).

Figure 18:
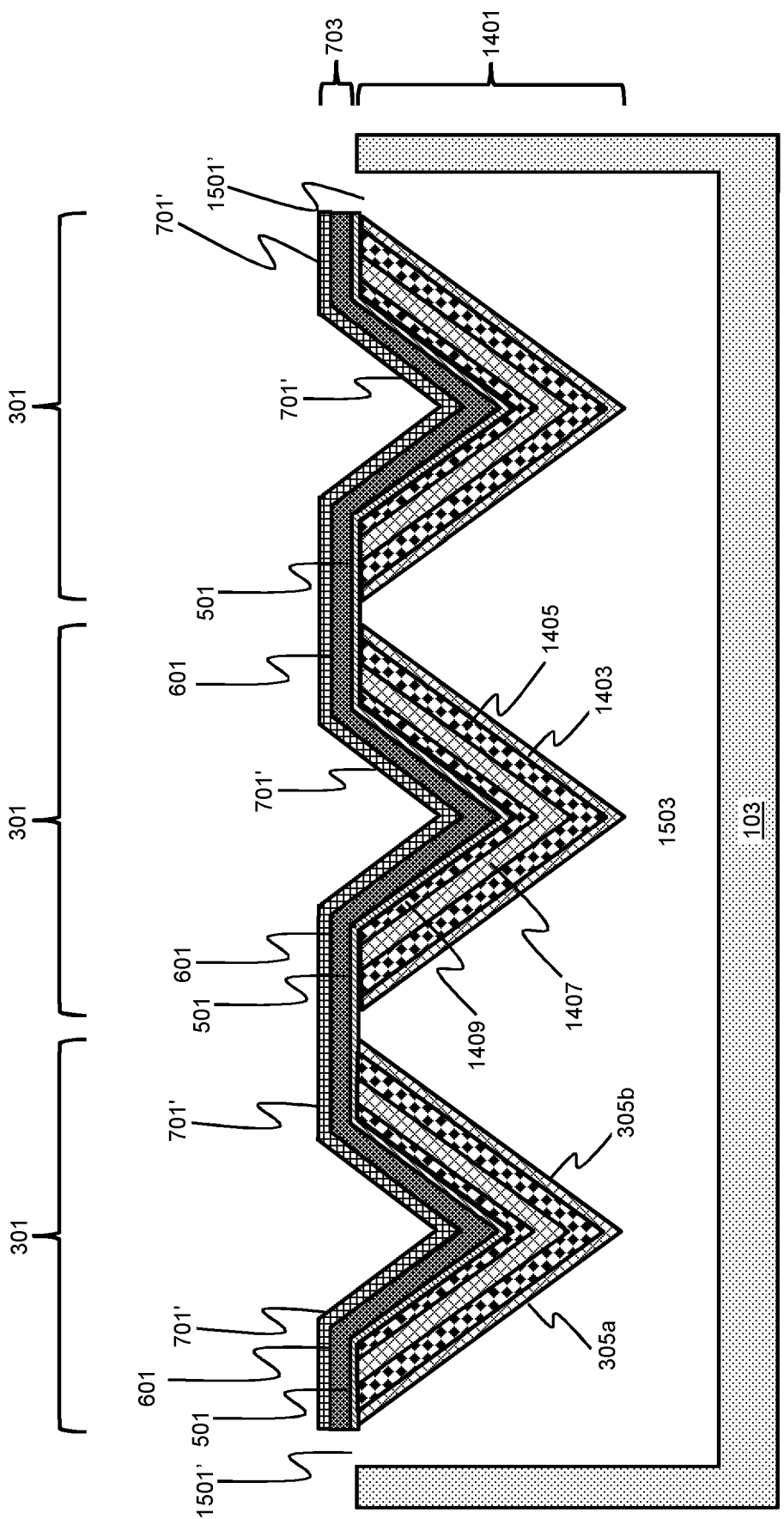
FIG. 18 schematically illustrates a cross-sectional view of a FIG. 15 with a sheet top electrode over the thin-film piezoelectric layer of the shear-mode acoustic wave filter, in accordance with an exemplary embodiment.

FIG. 18 schematically illustrates a cross-sectional view of a FIG. 15 with a sheet top electrode over the thin-film piezoelectric layer of the shear-mode acoustic wave filter, in accordance with an exemplary embodiment, in accordance with an exemplary embodiment. FIG. 18 is nearly identical to FIG. 15, except, in this instance, the vias 1501' are formed through the metal layer 701', the thin-film piezoelectric layer 601, the metal layer 501 down to the [100] crystal orientation Si layer 103 and then the [100] crystal orientation Si layer 103 is patterned through the vias 1501' and a release is performed to form the cavity 1503.

Figure 19:
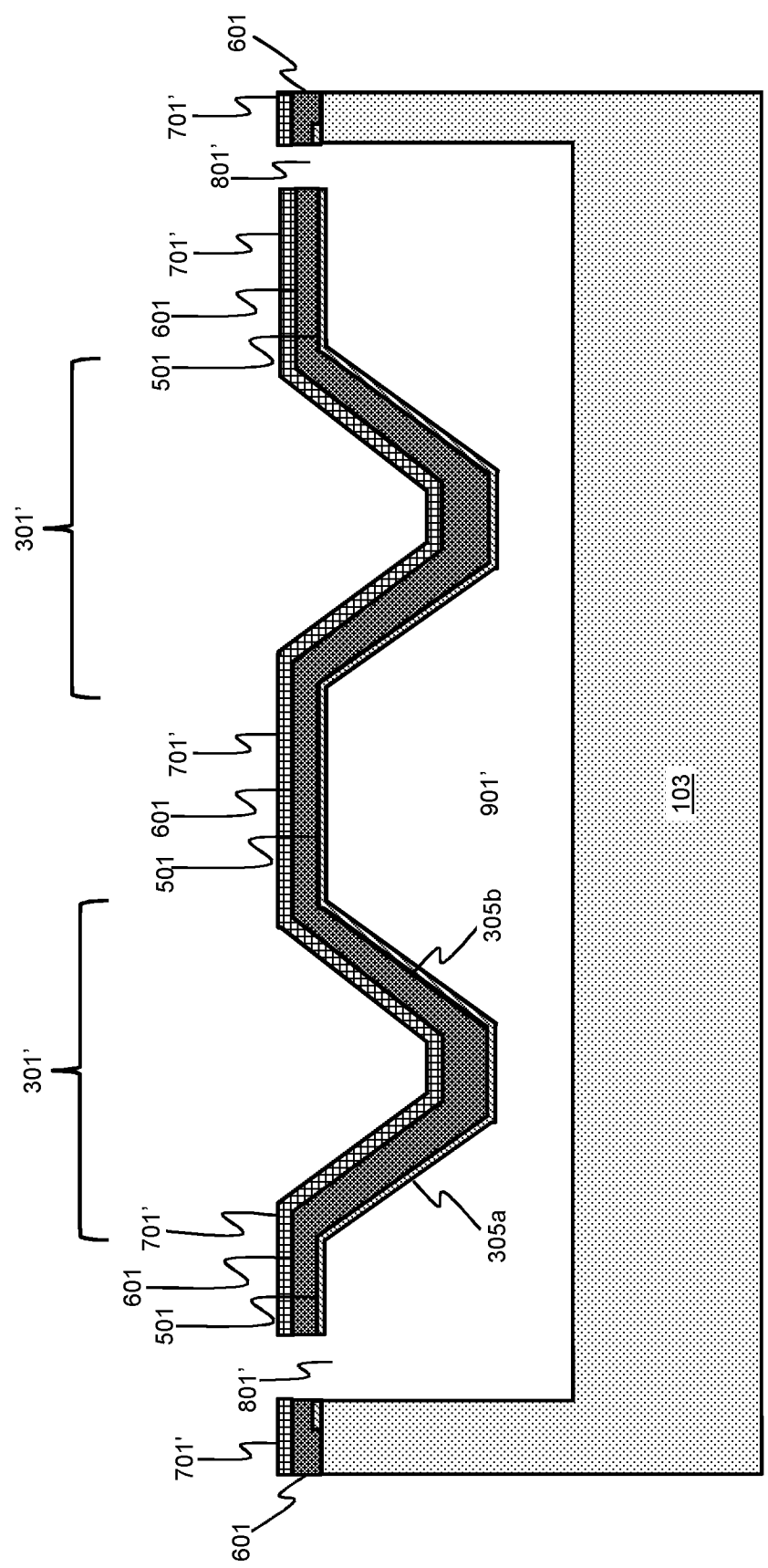
FIG. 19 schematically illustrates a cross-sectional view of a shear-mode acoustic wave filter with a sheet top electrode on V-shaped grooves of a [100] crystal orientation Si layer with flat bottoms over a cavity and a substrate, in accordance with an exemplary embodiment.

FIG. 19 schematically illustrates a cross-sectional view of a shear-mode acoustic wave filter with a sheet top electrode on V-shaped grooves of a [100] crystal orientation Si layer with flat bottoms over a cavity and a substrate, in accordance with an exemplary embodiment. FIG. 19 is nearly identical to FIG. 16; however, in this instance, the distance and the size of the apertures in the mask (not shown for illustrative convenience) used to form the V-shaped grooves 301' are such that the V-shaped grooves 301' are formed with a flat bottom.

Figure 20B:
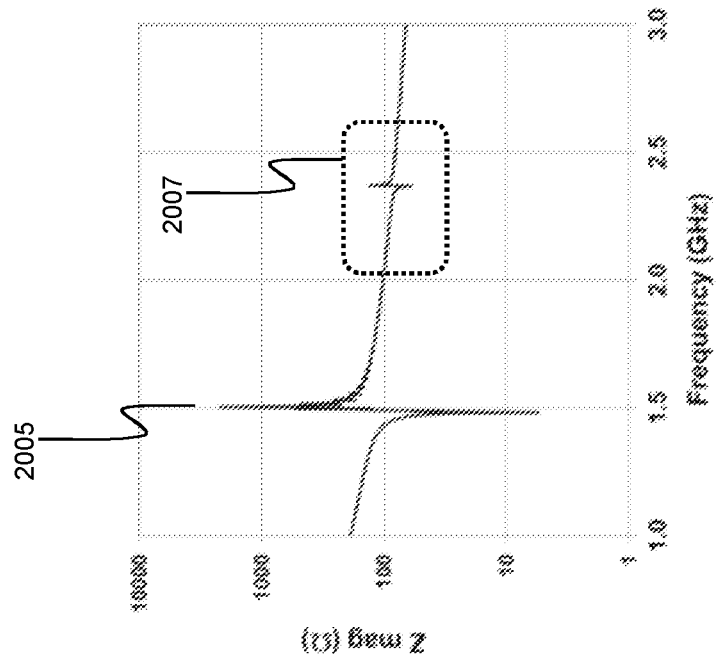
FIG. 20B illustrates sample shear mode $k^2_{15}$ and longitudinal mode $k^2_{33}$ results of a shear-mode acoustic wave filter on V-shaped grooves of a [100] crystal orientation Si layer over a substrate, in accordance with an exemplary embodiment.
Figure 20A:
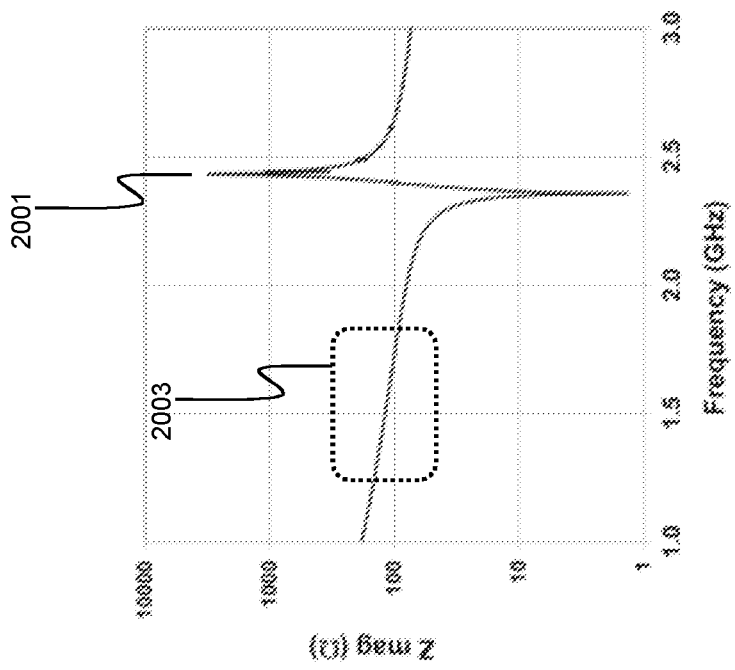
FIG. 20A illustrates sample shear mode $k^2_{15}$ and longitudinal mode $k^2_{33}$ results of a background BAW filter.

FIG. 20A illustrates sample shear mode $k^2_{15}$ and longitudinal mode $k^2_{33}$ results of a background BAW filter and FIG. 20B illustrates sample shear mode $k^2_{15}$ and longitudinal mode $k^2_{33}$ results of a shear-mode acoustic wave filter on V-shaped grooves of a [100] crystal orientation Si layer over a substrate, in accordance with an exemplary embodiment. Referring to FIG. 20A, sample shear mode $k^2_{15}$ and longitudinal mode $k^2_{33}$ results of a flat acoustic filter (not shown for illustrative convenience), i.e., the bottom electrode, the thin-film piezoelectric layer, and the top electrode are formed at 0°, are illustrated. Specifically, the crystal poling component is only along the Y-axis, which results in a strong shear mode coupling coefficient $k^2_{33}$, e.g., 7%, as illustrated by the peak 2001, and a weak/null longitudinal mode coupling coefficient $k^2_{15}$, e.g., 0%, as highlighted by the box 2003. In contrast, sample shear mode $k^2_{15}$ and longitudinal mode $k^2_{33}$ results of the shear-mode acoustic wave filter 703 formed on V-shaped grooves 301 of the [100] crystal orientation Si layer 103 at a 54° angle, are depicted in FIG. 20B. Specifically, the crystals of the thin-film piezoelectric layer 601 are tilted such that the crystal poling component is along both the X and Y axis, which results in a strong shear mode coefficient $k^2_{33}$, e.g., >4%, as illustrated by the peak 2005, and a weak/null longitudinal mode coupling coefficient $k^2_{15}$, e.g., 0.3%, as highlighted by the box 2007.

The embodiments of the present disclosure can achieve several technical effects such as a shear-mode acoustic wave filter with a greater $d_{15}$ piezoelectric constant and a shear-mode coupling coefficient relative to known acoustic filters formed on non-tilted, non-V-shaped grooved layers/substrates; a multi-frequency shear-mode filter bank with larger bandwidth relative to known acoustic filters; a shear-mode acoustic wave filter with reduced warping of the free-standing structure and reduced frequency variation relative to known acoustic filters; and customizable shear-mode and longitudinal-mode coupling coefficients and intensities by tailoring the V-shaped groove angles. Further, the embodiments of the present disclosure can achieve a shear-mode filter capable of operation in a liquid environment with negligible/low Q factor degradation. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any devices including an acoustic wave filter.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a set of V-shaped grooves in a [100] crystal orientation silicon (Si) layer over a substrate; and
    forming a shear-mode acoustic wave filter over the V-shaped grooves, the shear-mode acoustic wave filter comprising a first metal layer, a thin-film piezoelectric layer, and a second metal layer,
    wherein the second metal layer comprises an interdigitated (IDT) pattern or a sheet.

2. The method according to claim 1, further comprising:
    forming pairs of vias through the thin-film piezoelectric layer and the first metal layer and optionally through the second metal layer, the thin-film piezoelectric layer, and the first metal layer down to the [100] crystal orientation Si layer subsequent to the forming of the shear-mode acoustic wave filter, each via of each of the pairs of vias formed on an opposite side of the set of V-shaped grooves; and forming a cavity in the [100] crystal orientation Si layer under the first metal layer, the cavity extending beyond the set of V-shaped grooves,
wherein the pairs of vias are formed through second metal layer when the second metal layer is the sheet.

3. The method according to claim 2, comprising forming each opposing slope of the V-shaped grooves with an angle of 54.7 degrees by a wet etch or with an angle between 10 degrees and 70 degrees by a dry etch.

4. The method according to claim 2, wherein the IDT pattern has a same or a different lateral width across the set of V-shaped grooves.

5. The method according to claim 2, wherein the V-shaped grooves are formed by a wet etch and the second metal layer is the sheet, the method comprising forming the V-shaped grooves with a flat bottom.

6. The method according to claim 1, further comprising:
forming a Bragg reflector along the V-shaped grooves prior to the forming of the shear-mode acoustic wave filter; and
forming the shear-mode acoustic wave filter over the Bragg reflector.

7. The method according to claim 6, further comprising:
forming pairs of vias through the thin-film piezoelectric layer and the first metal layer and optionally through the second metal layer, the thin-film piezoelectric layer, and the first metal layer down to the [100] crystal orientation Si layer subsequent to the forming of the shear-mode acoustic wave filter, each via of each of the pairs of vias formed on an opposite side of the set of V-shaped grooves; and
forming a cavity in the [100] crystal orientation Si layer under the Bragg reflector, the cavity extending beyond the set of V-shaped grooves,
wherein the pairs of vias are formed through second metal layer when the second metal layer is the sheet.

8. The method according to claim 7, comprising forming each opposing slope of the V-shaped grooves with an angle of 54.7 degrees by a wet etch or with an angle between 10 degrees and 70 degrees by a dry etch.

9. A device comprising:
a set of V-shaped grooves in a [100] crystal orientation silicon (Si) layer over a substrate; and
a shear-mode acoustic wave filter over the V-shaped grooves, the shear-mode acoustic wave filter comprising a first metal layer, a thin-film piezoelectric layer, and a second metal layer,
wherein the second metal layer comprises an interdigitated (IDT) pattern or a sheet.

10. The device according to claim 9, further comprising:
pairs of vias through the thin-film piezoelectric layer and the first metal layer and optionally through the second metal layer, the thin-film piezoelectric layer, and the first metal layer down to the [100] crystal orientation Si layer, each via of each of the pairs of vias formed on an opposite side of the set of V-shaped grooves; and
a cavity in the [100] crystal orientation Si layer under the first metal layer, the cavity extending beyond the set of V-shaped grooves,
wherein the pairs of vias are formed through second metal layer when the second metal layer is the sheet.

11. The device according to claim 10, wherein each opposing slope of the V-shaped grooves has an angle of 54.7 degrees or an angle between 10 degrees and 70 degrees.

12. The device according to claim 10, wherein the IDT pattern has a same or a different lateral width across the set of V-shaped grooves.

13. The device according to claim 10, wherein the set of V-shaped grooves comprises a row or a column of 10 V-shaped grooves, 10 rows or 10 columns of the 10 V-shaped grooves, or a plurality of V-shaped grooves.

14. The device according to claim 10, wherein the second metal layer is the sheet, the V-shaped grooves have a flat bottom.

15. The device according to claim 9, further comprising:
a Bragg reflector along the V-shaped grooves; and
the shear-mode acoustic wave filter over the Bragg reflector.

16. The device according to claim 15, wherein each opposing slope of the V-shaped grooves has an angle of 54.7 degrees or an angle between 10 degrees and 70 degrees.

17. The device according to claim 15, wherein the Bragg reflector comprises layers of alternating high and low acoustic impedance thin-film material.

18. The device according to claim 15, further comprising:
pairs of vias through the thin-film piezoelectric layer and the first metal layer and optionally through the second metal layer, the thin-film piezoelectric layer, and the first metal layer down to the [100] crystal orientation Si layer, each via of each of the pairs of vias formed on an opposite side of the set of V-shaped grooves; and
a cavity in the [100] crystal orientation Si layer under the Bragg reflector, the cavity extending beyond the set of V-shaped grooves,
wherein the pairs of vias are formed through second metal layer when the second metal layer is the sheet.

19. The device according to claim 18, wherein the set of V-shaped grooves comprises a row or a column of 10 V-shaped grooves, 10 rows or 10 columns of the 10 V-shaped grooves, or a plurality of V-shaped grooves.

20. A device comprising:
a set of a [111] V-shaped grooves in a [100] crystal orientation silicon (Si) layer over a substrate of sapphire, silica glass, or [111] crystal orientation Si, each opposing slope of the [111] V-shaped grooves having an angle between 10 degrees and 70 degrees;
a shear-mode acoustic wave filter over the set of the [111] V-shaped grooves, the shear-mode acoustic wave filter comprising a first metal layer, a thin-film piezoelectric layer, and a second metal layer in an interdigitated (IDT) pattern with a same or a different lateral width across the set of the [111] V-shaped grooves; pairs of vias through the thin-film piezoelectric layer and the first metal layer down to the [100] crystal orientation Si layer, each via of each of the pairs of vias formed on an opposite side of the set of the [111] V-shaped grooves; and
a cavity in the [100] crystal orientation Si layer under the shear-mode acoustic filter, the cavity extending beyond the set of the [111] V-shaped grooves.

* * * * *